US012598734B2

(12) United States Patent
Fulford et al.

(10) Patent No.: US 12,598,734 B2
(45) Date of Patent: Apr. 7, 2026

(54) METHOD OF MAKING 3D MEMORY STACKING FORMATION WITH HIGH CIRCUIT DENSITY

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 575 days.

(21) Appl. No.: 18/073,118

(22) Filed: Dec. 1, 2022

(65) Prior Publication Data

US 2023/0301061 A1    Sep. 21, 2023

Related U.S. Application Data

(60) Provisional application No. 63/320,469, filed on Mar. 16, 2022.

(51) Int. Cl.
| | |
|---|---|
| *H10B 12/00* | (2023.01) |
| *H10D 1/68* | (2025.01) |
| *H10D 30/67* | (2025.01) |

(52) U.S. Cl.
CPC ............. *H10B 12/30* (2023.02); *H10B 12/03* (2023.02); *H10B 12/05* (2023.02); *H10D 1/68* (2025.01); *H10D 30/6735* (2025.01); *H10D 30/6755* (2025.01); *H10D 30/6757* (2025.01)

(58) Field of Classification Search
CPC ............................................. H10B 12/30–488
See application file for complete search history.

(56) References Cited

U.S. PATENT DOCUMENTS

| | | | | |
|---|---|---|---|---|
| 2019/0103407 A1* | 4/2019 | Kim | ....................... | H10B 12/30 |
| 2021/0057419 A1* | 2/2021 | Shin | ....................... | H10B 12/30 |
| 2021/0375875 A1* | 12/2021 | Brewer | ............. | H10D 30/6757 |
| 2022/0085023 A1* | 3/2022 | Shin | ....................... | H10B 12/03 |
| 2022/0093532 A1* | 3/2022 | Lee | ....................... | H10B 12/30 |
| 2022/0102358 A1* | 3/2022 | Park | ....................... | H10B 12/03 |
| 2022/0199624 A1* | 6/2022 | Huang | .................. | H10B 53/30 |
| 2022/0208766 A1* | 6/2022 | Kim | ....................... | H10B 12/05 |

* cited by examiner

*Primary Examiner* — Kevin Parendo
(74) *Attorney, Agent, or Firm* — Oblon, McClelland, Maier & Neustadt, L.L.P.

(57) ABSTRACT

A semiconductor device includes a stack of dynamic random access memory (DRAM) cell units over a substrate in a vertical direction perpendicular to a working surface of the substrate. At least one DRAM cell unit includes a transistor and a capacitor. The capacitor includes a first metal layer, a capacitor dielectric layer positioned on the first metal layer, and a second metal layer positioned on the capacitor dielectric layer. The capacitor is elongated in a horizontal direction parallel to the working surface of the substrate. The second metal layer has a first end and a second end in the horizontal direction. The transistor includes a channel structure, and a gate structure disposed all around the channel structure. The first metal layer extends in the horizontal direction beyond the first end of the second metal layer to form a drain region and a source region of the transistor.

20 Claims, 13 Drawing Sheets

200

Start

↓

Form a stack of capacitors over a substrate in a vertical
direction perpendicular to a working surface of the substrate    ∿S210

↓

Form a stack of transistors over the substrate in the vertical
direction    ∿S220

↓

End

METHOD OF MAKING 3D MEMORY STACKING FORMATION WITH HIGH CIRCUIT DENSITY

INCORPORATION BY REFERENCE

This present disclosure claims the benefit of U.S. Provisional Application No. 63/320,469, filed on Mar. 16, 2022, which is incorporated herein by reference in its entirety. Aspects of the present disclosure are related to Applicant's patent application Ser. No. 17/946,715 filed on Sep. 16, 2022, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

According to a first aspect of the disclosure, a semiconductor device is provided. The semiconductor device includes a stack of dynamic random access memory (DRAM) cell units over a substrate in a vertical direction perpendicular to a working surface of the substrate. At least one DRAM cell unit includes a transistor and a capacitor. The capacitor includes a first metal layer, a capacitor dielectric layer positioned on the first metal layer, and a second metal layer positioned on the capacitor dielectric layer. The capacitor is elongated in a horizontal direction parallel to the working surface of the substrate. The second metal layer has a first end and a second end in the horizontal direction. The transistor includes a channel structure, and a gate structure disposed all around the channel structure. The first metal layer extends in the horizontal direction beyond the first end of the second metal layer to form a drain region and a source region of the transistor.

In some embodiments, the channel structure includes a semiconducting oxide positioned between the drain region and the source region. In some embodiments, the channel structure further includes a two-dimensional (2D) semiconductor material disposed all around the semiconducting oxide. In some embodiments, the 2D semiconductor material extends beyond the semiconducting oxide in the horizontal direction and is disposed all around the drain region and the source region.

In some embodiments, a common ground structure is configured to electrically connect to a plurality of second metal layers on respective second ends.

In some embodiments, the first metal layer is coplanar with the channel structure, and the drain region and the source region of the first metal layer are in direct contact with the channel structure.

In some embodiments, a capacitor metal portion of the first metal layer, which is in direct contact with the capacitor dielectric layer, is wider than the drain region and the source region in another horizontal direction.

In some embodiments, the channel structure is configured to have a current flow path in the horizontal direction.

In some embodiments, a dielectric material is positioned between the gate structure and the capacitor dielectric layer. In some embodiments, the capacitor dielectric layer includes a horizontal portion positioned between the second metal layer and the first metal layer. The capacitor dielectric layer also includes a vertical portion positioned between the second metal layer and the dielectric material.

According to a second aspect of the disclosure, a method of manufacturing a semiconductor device is provided. The method includes forming a stack of capacitors over a substrate in a vertical direction perpendicular to a working surface of the substrate. Each capacitor is formed by forming a respective first metal layer, forming a respective capacitor dielectric layer on the respective first metal layer, and forming a respective second metal layer on the respective capacitor dielectric layer. Each capacitor is elongated in a horizontal direction parallel to the working surface of the substrate, and each second metal layer has a respective first end and a respective second end in the horizontal direction. A stack of transistors is formed over the substrate in the vertical direction. Each transistor is formed by forming a respective channel structure, and forming a respective gate structure all around the respective channel structure. Each first metal layer extends in the horizontal direction beyond the respective first end of the respective second metal layer to form a respective drain region and a respective source region of the respective transistor.

In some embodiments, the forming the stack of transistors includes forming a respective semiconducting oxide between each drain region and the respective source region. In some embodiments, a respective two-dimensional (2D) semiconductor material is formed all around each semiconducting oxide. In some embodiments, each 2D semiconductor material extends beyond the respective semiconducting oxide in the horizontal direction and is disposed all around the respective drain region and the respective source region.

In some embodiments, a common ground structure, which is configured to electrically connect to each second metal layer on the respective second end, is formed.

In some embodiments, each channel structure is formed in a respective first metal layer. Sacrificial material is formed over and below each channel structure. In some embodiments, the stack of transistors is uncovered from two opposing sides. The sacrificial material is removed. Each gate structure is formed all around the respective channel structure. In some embodiments, a respective drain region and a respective source region are uncovered as a result of the removing the sacrificial material.

In some embodiments, a plurality of stacks of capacitors is formed and a plurality of stacks of transistors is formed by a directional etching process. Each stack of capacitors is configured to electrically couple to a respective stack of transistors to form a respective stack of dynamic random access memory (DRAM) cell units.

In some embodiments, a respective capacitor metal portion of each first metal layer, which is in direct contact with the respective capacitor dielectric layer, is wider than the respective drain region and the respective source region in another horizontal direction.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figures 1A, 1B, 1C:
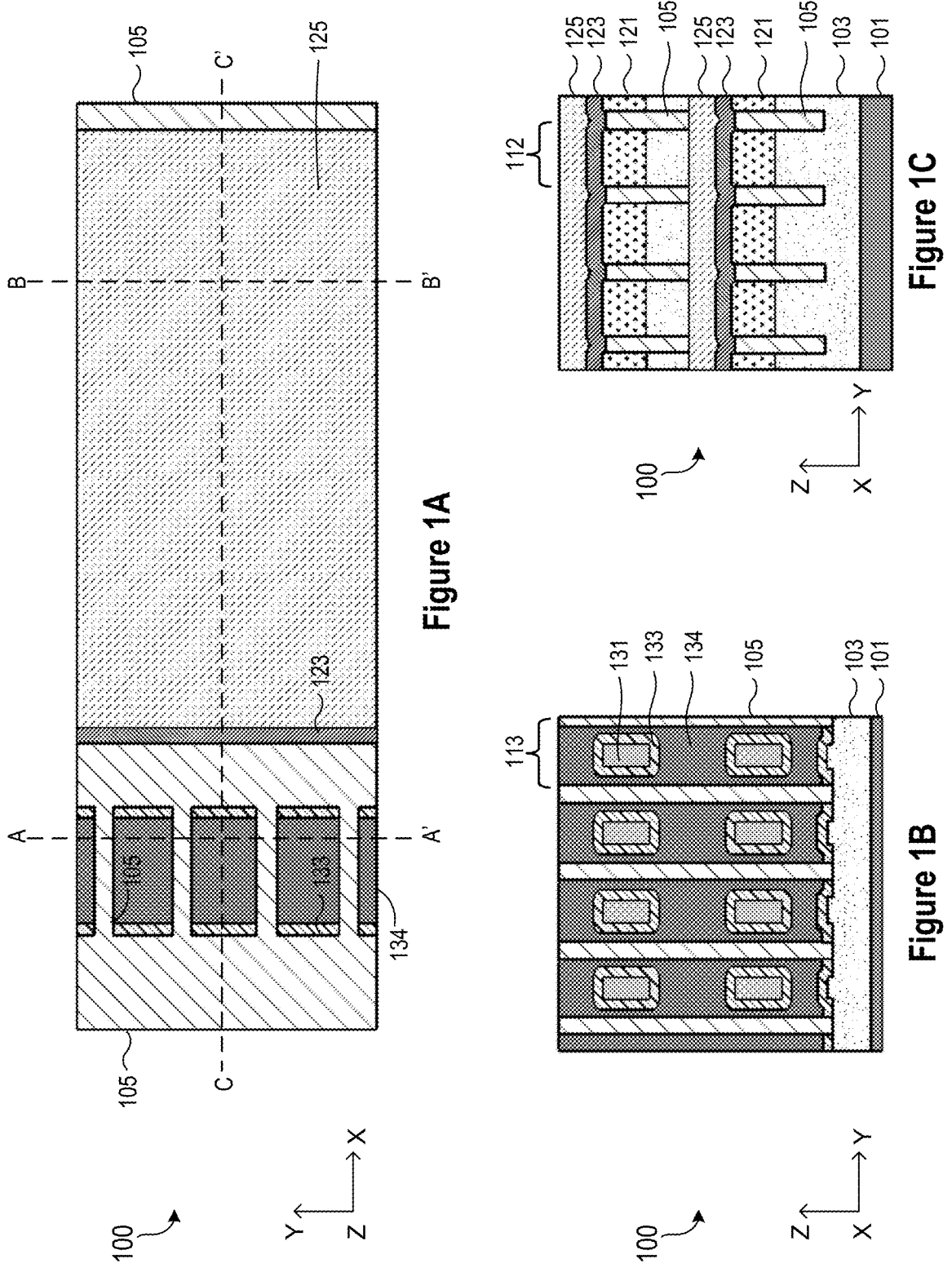
FIG. 1A shows a top view of a semiconductor device in accordance with one embodiment of the present disclosure.
FIGS. 1B, 1C and 1D show vertical cross-sectional views taken along line cuts AA', BB' and CC' in FIG. 1A respectively in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on a chip)) is being pursued.

Techniques herein include methods and designs for memory cells. Embodiments include a 3D (vertically stacked) horizontal DRAM cell with a highly reliable access transistor with a metal capacitor to increase circuit density for 3D memory. Embodiments herein can enable a novel stacking of DRAM memory cells of N-tall without limit.

Embodiments include a nanosheet transistor and wrapped-around capacitor with doped conductive oxide (or semiconducting oxide). There are options for connections for source/drain, gate and capacitor. This is highly suitable for hierarchical design of N-number stack. Source/drain connections can be staircase (stepped) for N-stack design. Capacitor connections are shorted to each other and easy to hook up to ground. Gate terminals are shorted together in each vertical 3D stack and easy to connect. 2D horizontal 3D DRAM Features include nanosheet transistor and wrapped-around capacitor with doped 2D Material. 2D material invention integration method is shown. Instead of conductive oxide, the layer can optionally be any other existing oxide on which 2D material can grow selectively.

Techniques provided herein may use alternative semiconductors in the microfabrication of semiconductor devices. Such semiconductors herein can be alternatives to silicon, germanium, gallium arsenide, and other commonly used semiconductors. Semiconductors and structures herein can include semiconductive oxides (also known as semiconducting oxides or oxide semiconductors), semiconductive 2D materials (also known as 2D semiconductor materials), and other semiconductive materials. This includes semiconductors (materials) that can be formed at relatively low temperatures and without epitaxy.

Semiconductive materials herein may have properties similar to elemental semiconductor materials, and can be used to fabricate vertical stacks or planes of transistors. Note that given transistors within the vertical stacks can have channels with horizontal or vertical orientation relative to a working surface of the substrate. Certain materials, when combined with oxygen, may form new materials that exhibit semiconductor properties. For example, these semiconductor materials can turn "off" with low off-state leakage current or can become highly conductive under certain circumstances. In other words, such materials have an electrical conductivity value falling between an electrical conductor and an electrical insulator. Some examples of N-type semiconductive materials for channels include $In_2O_3$, $SnO_2$, InGaZnO, and ZnO. One example of a P-type semiconductive material for channels is SnO. Thus, a "semiconductive oxide" herein is an oxygen-containing material having semiconductor properties. Additionally, or alternatively, materials and channels may comprise a 2D material. Some example 2D materials for use in forming a channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. A "semiconductive 2D material" herein is a 2D material with semiconductor properties. The 2D materials described herein may be deposited by, for example, an atomic layer deposition (ALD) process and may be 5-15 angstroms thick, the thinness lending to their name-2D material. Other deposition techniques may also be used, including but not limited to, chemical vapor deposition (CVD), physical vapor deposition (PVD), and plasma-enhanced deposition techniques. The materials may be annealed during or after the device formation process to recrystallize or grow the crystals and thereby improve electrical characteristics. Thus forming a semiconductive material can include deposition and annealing. A "semiconductive material" herein can be any material with semiconductor properties. Such materials can include elements or compounds normally associated with dielectrics. Such materials can include compounds formed with or without requiring a seed layer, and can be formed at temperatures lower than about 500-600 degrees Celsius.

Semiconductive materials that can be formed/deposited on a substrate without requiring a seed layer and/or at processing temperatures lower than 600 degrees Celsius are beneficial in forming vertical stacks or planes of transistors (3D transistors). In contrast, semiconductors used to make conventional semiconductor devices are often formed by epitaxy, which requires a seed layer for growth. Requiring a seed layer can mean a need to uncover a particular material on a substrate that might be covered by many layers and structures. As can be appreciated, without needing to integrate access to a seed layer into a given fabrication flow, a semiconductive material can be easily formed over an existing plane of transistors to create an additional plane of transistors. Moreover, formation of conventional semiconductors can require high temperature deposition and annealing (greater than about 600 degree Celsius). After initial high temperature processing, additional materials are added that may not tolerate high temperature processing. This means that if a first plane of transistors is formed, adding a second plane of transistors that needs high temperature processing can damage the first plane of transistors, leading to device failure. Accordingly, semiconductor materials that can be formed at less than 600 degrees Celsius are desirable. Without requiring a seed layer or high temperature processing, semiconductive materials herein can be formed on many different surfaces, easily integrate with various fabrication flows, and help enable vertical stacking of transistors.

Figure 1D:
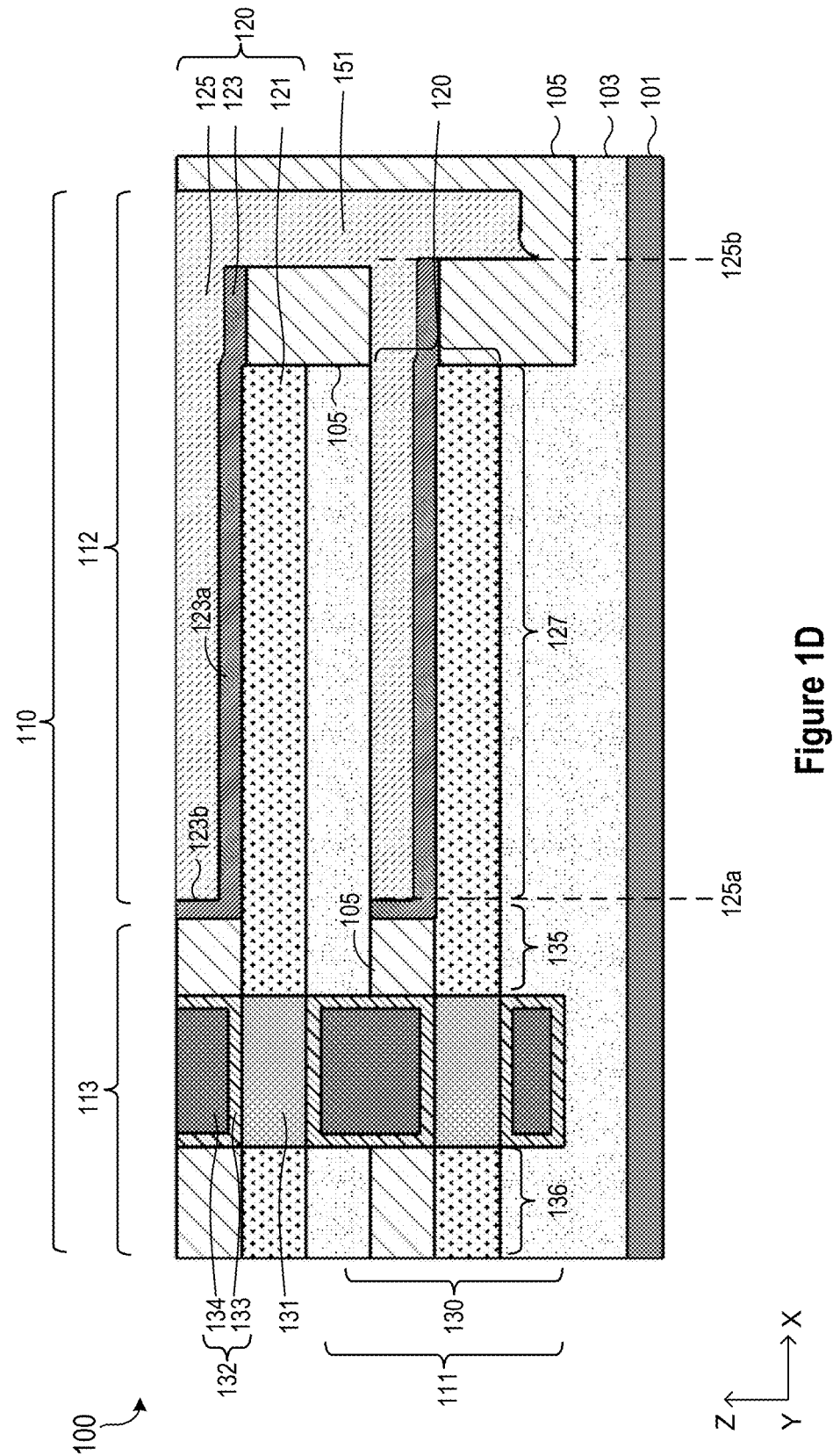

FIG. 1A shows a top view of a semiconductor device 100 in accordance with one embodiment of the present disclosure. FIGS. 1B, 1C and 1D show vertical cross-sectional views taken along the line cuts AA', BB' and CC' in FIG. 1A respectively in accordance with some embodiments of the present disclosure.

As illustrated, the semiconductor device 100 includes a substrate 101 and a stack of dynamic random access memory (DRAM) cell units (hereinafter referred to as a memory stack 110). The memory stack 110 includes a stack of capacitors (hereinafter referred to as a capacitor stack 112) and a stack of transistors (hereinafter referred to as a transistor stack 113) adjacent to each other. The memory stack 110 includes a plurality of DRAM cell units stacked over the substrate 101 in the Z direction. Consider a DRAM cell unit 111 of the memory stack 110 for example. The DRAM cell unit 111 includes a capacitor 120 that is configured to be electrically coupled to a transistor 130.

Specifically, the capacitor 120 includes a first metal layer 121 (or a first conductive structure), a capacitor dielectric layer 123 positioned on the first metal layer 121, and a second metal layer 125 (or a second conductive structure) positioned on the capacitor dielectric layer 123. Notably, the capacitor 120 is elongated in the X direction (relative to the Z direction). Shape of the capacitor 120 may vary, depending on specific design requirements. For example, the first metal layer 121, the capacitor dielectric layer 123 and the second metal layer 125 can be nanosheets.

As shown, the second metal layer 125 has a first end 125a and a second end 125b in the X direction. The capacitor dielectric layer 123 and the second metal layer 125 can both extend beyond the first end 125a of the second metal layer 125 in the X direction. The capacitor dielectric layer 123 can include a horizontal portion 123a positioned between the second metal layer 125 and the first metal layer 121, in addition to a vertical portion 123b positioned between the second metal layer 125 and a dielectric material 105. In another embodiment, the capacitor dielectric layer 123 may include only the horizontal portion 123a, without the vertical portion 123b. Besides, the first metal layer 121, the capacitor dielectric layer 123 and the second metal layer 125 can be configured to be etch-selective relative to each other. Accordingly, the first metal layer 121 and the second metal layer 125 can include different metal materials.

The transistor 130 includes a channel structure 131 and a gate structure 132 disposed all around the channel structure 131. The gate structure 132 includes at least one gate dielectric 133 (such as a high-k dielectric) and at least one gate metal 134 (such as a work function metal). In this example, the gate structure 132 is a common gate structure for a plurality of transistors (or channel structures) stacked in the Z direction. Note that the first metal layer 121 can extend in the X direction beyond the first end 125a of the second metal layer 125 to form source/drain (S/D) regions of the transistor 130. For example, the first metal layer 121 can include a drain region 135 and a source region 136 of the transistor 130. Accordingly, the channel structure 131 can be configured to have a current flow path in the X direction. In this example, the channel structure 131 includes a semiconducting oxide. The channel structure 131 is coplanar with or disposed in the first metal layer 121. As a result, the drain region 135 and the source region 136 are separated by the channel structure 131.

As shown, the first metal layer 121 further includes a capacitor metal portion 127 which is connected to the drain region 135. That is, the capacitor 120 and the transistor 130 can be configured to electrically couple with each other. Thus, the DRAM cell unit 111 can be configured to function as a horizontal DRAM cell and be stacked in the Z direction. In some embodiments, the capacitor metal portion 127 of the first metal layer 121, which is in direct contact with the capacitor dielectric layer 123, is wider than the drain region 135 and the source region 136 in the Y direction (not shown), which will be explained and illustrated in FIG. 4A.

The semiconductor device 100 can also include a common ground structure 151 that is configured to electrically connect to a plurality of second metal layers (e.g. 125) on respective second ends (e.g. 125b). The common ground structure 151 and the plurality of first metal layers may include a same metal material. The dielectric material 105 is disposed between first metal layers (e.g. 121) and the common ground structure 151 in order to electrically separate the first metal layers from the common ground structure 151.

In some embodiments, the semiconductor device 100 can include dielectric materials, e.g. as shown by 103, 105, 123 and 133. The dielectric materials may also be referred to as isolation structures, isolation layers, diffusion breaks, gate dielectrics, capping layers, spacers, etc. depending on functions thereof. For example, the dielectric material 103 can separate capacitors (e.g. 120) of the capacitor stack 112 from each other. The dielectric materials may be the same as or different from each other.

In the example of FIG. 1A, the memory stack 110 includes two DRAM cell units 111 stacked in the Z direction. That is, the capacitor stack 112 includes two capacitors 120 stacked in the Z direction while the transistor stack 113 includes two transistors 130 stacked in the Z direction. It should be understood that the memory stack 110 can include any number of DRAM cell units 111 stacked in the Z direction. Moreover, DRAM cell units can be similar to the DRAM cell unit 111 while having some differences. For example, channel structures of the DRAM cell units can include different chemical compositions from one another. That is, the channel structures (e.g. 131) can include different semiconductor materials, different dopants and/or different dopant concentration profiles. Similarly, first metal layers (e.g.

121), capacitor dielectric layers (e.g. 123) second metal layers (e.g. 125) of capacitors can include different metal materials or different dielectric materials from one another. Further, while four memory stacks 110 are shown and separated from each other by the dielectric material 105, it should be understood that the semiconductor device 100 can include any number of memory stacks (e.g. 110) arranged in the XY plane.

Figures 1E, 1F:
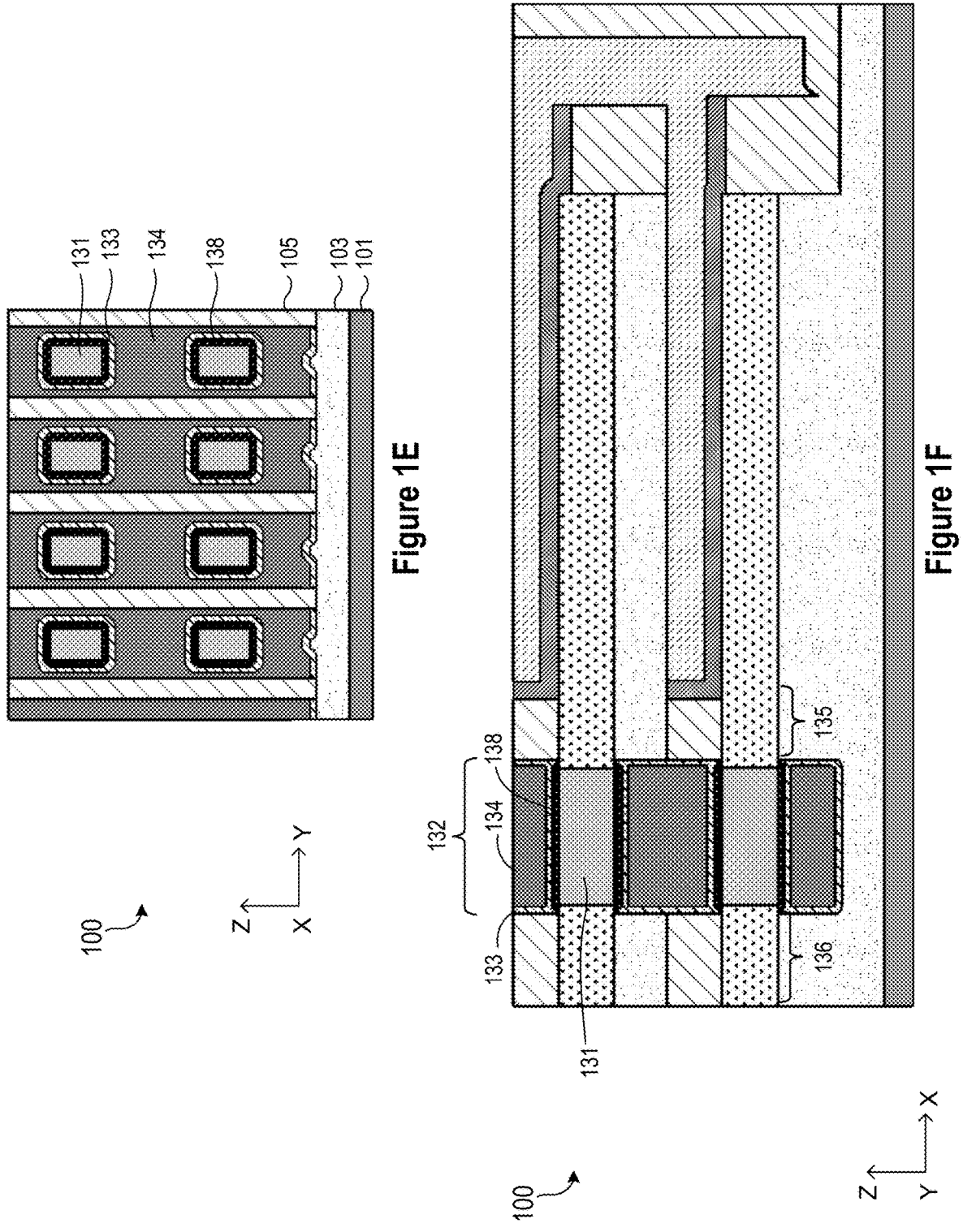
FIGS. 1E and 1F show vertical cross-sectional views taken along line cuts AA' and CC' in FIG. 1A respectively in accordance with some embodiments of the present disclosure.

FIGS. 1E and 1F show vertical cross-sectional views taken along line cuts AA' and CC' in FIG. 1A respectively in accordance with alternative embodiments of the present disclosure. As discussed above, the channel structure 131 can include a semiconducting oxide. Herein, the channel structure 131 can further include a two-dimensional (2D) semiconductor material 138 that is disposed all around the semiconducting oxide. The 2D semiconductor material 138 can extend beyond the semiconducting oxide in the X direction and thus be in direct contact with the drain region 135 and the source region 136. The 2D semiconductor material 138 can be disposed all around the semiconducting oxide, the drain region 135 and the source region 136.

Figure 2:
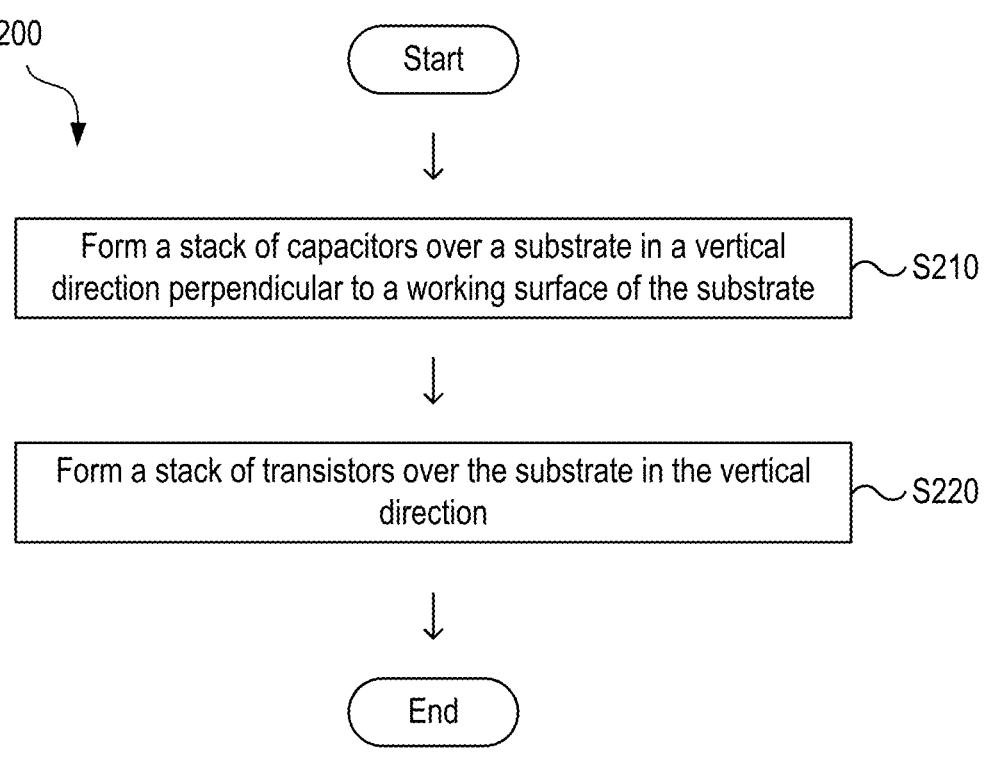
FIG. 2 shows a flow chart of a process for manufacturing a semiconductor device, in accordance with some embodiments of the present disclosure.

FIG. 2 shows a flow chart of a process 200 for manufacturing a semiconductor device such as the semiconductor device 100, in accordance with some embodiments of the present disclosure. The process 200 starts with Step S210 where a stack of capacitors is formed over a substrate in a vertical direction perpendicular to a working surface of the substrate. In some embodiments, each capacitor is formed by forming a respective first metal layer, forming a respective capacitor dielectric layer on the respective first metal layer, and forming a respective second metal layer on the respective capacitor dielectric layer. Each capacitor is elongated in a horizontal direction parallel to the working surface of the substrate, and each second metal layer has a respective first end and a respective second end in the horizontal direction.

At Step S220, a stack of transistors is formed over the substrate in the vertical direction. In some embodiments, each transistor is formed by forming a respective channel structure, and forming a respective gate structure all around the respective channel structure. Each first metal layer extends in the horizontal direction beyond the respective first end of the respective second metal layer to form a respective drain region and a respective source region of the respective transistor.

FIGS. 3A, 4A, 5A, 6A, 7A, 8A and 9A show top views of a semiconductor device 300 at various intermediate steps of manufacturing, in accordance with some embodiments of the present disclosure. In some embodiments, the semiconductor device 300 can eventually become the semiconductor device 100 in FIGS. 1A-1F. Referring now to the figures, a horizontally-oriented DRAM access with metal capacitor will be described. In some embodiments, a nanosheet (thin layer) transistor and wrapped-around capacitor with doped conductive oxide will be formed. There are options for connections for source/drain, gate and capacitor. This is highly suitable for hierarchical design of N-number stack.

Figures 3A, 3B:
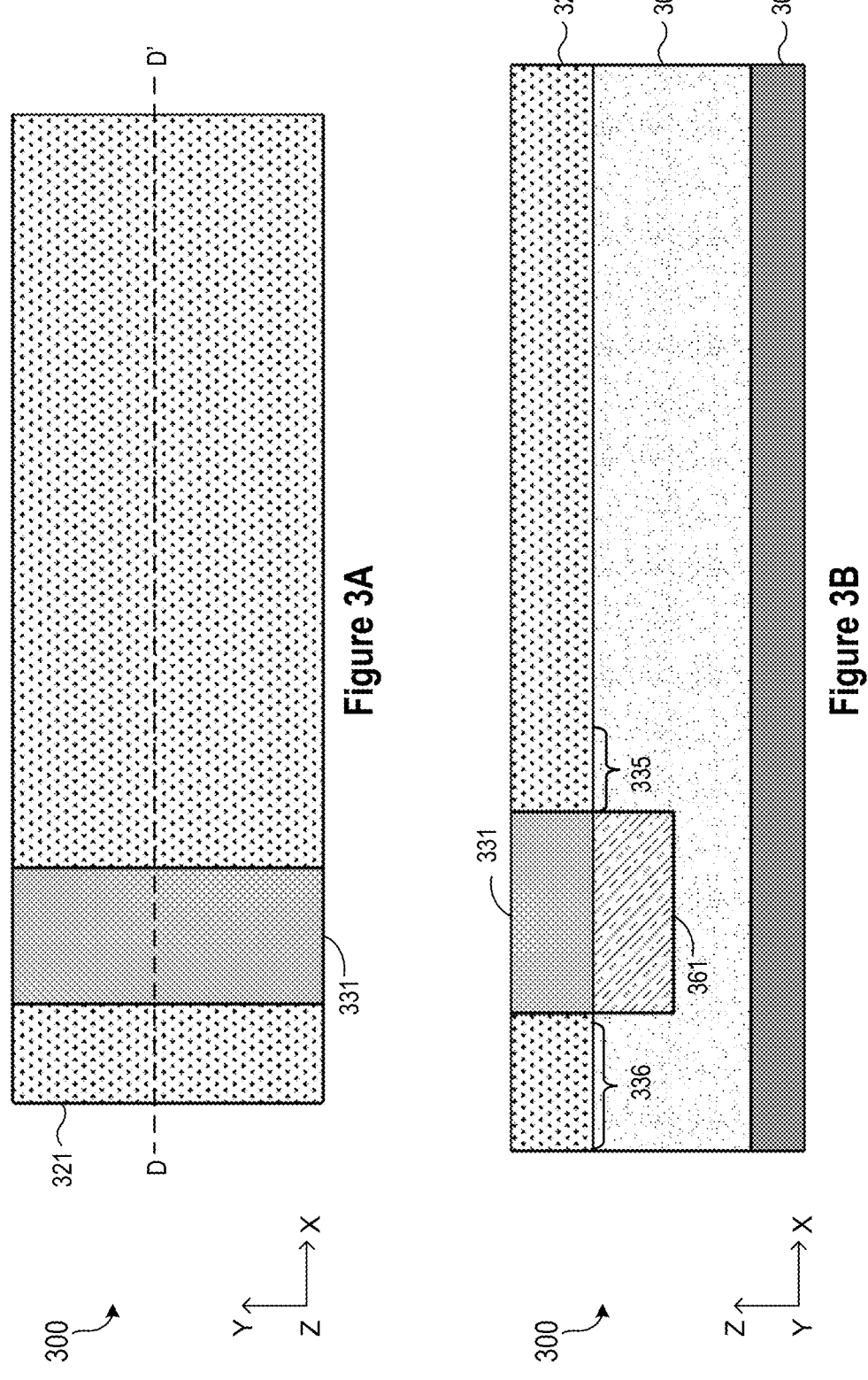
FIGS. 3A, 4A, 5A, 6A, 7A, 8A and 9A show top views of a semiconductor device at various intermediate steps of manufacturing, in accordance with some embodiments of the present disclosure.
FIG. 3B shows a vertical cross-sectional view taken along the line cut DD' in FIG. 3A in accordance with some embodiments of the present disclosure.

FIG. 3B can show a vertical cross-sectional view taken along the line cut DD' in FIG. 3A. In FIGS. 3A-3B, the semiconductor device 300 includes a substrate 301, a dielectric material 303 over the substrate 301, and a first metal layer 321 (or a first conductive layer structure) over the dielectric material 303. A sacrificial material 361 is formed in a recess of the dielectric material 303, and a channel structure 331 is formed in a recess of the first metal layer 321.

Note that the sacrificial material 361 and the channel structure 331 are aligned with each other. The sacrificial material 361 is configured to be etch-selective relative to the channel structure 331 and the dielectric material 303, and can include another dielectric material for example. The first metal layer 321 can include source/drain regions for the channel structure 331, for example a source region 336 and a drain region 335.

In one embodiment, a first dielectric (e.g. 303) is deposited on Si (e.g. 301). Using a bottom DRAM gate access mask (not shown), the first dielectric can be directionally etched while insulation is kept with Si substrate (partial etch into the first dielectric). After stripping off the photoresist, a second dielectric (e.g. 361) can be deposit-filled and then planarized using chemical-mechanical polishing (CMP) for example. As shown, the left side can be used for a transistor while the right side for a capacitor which is a long and thin strip. P-type semiconducting oxide (e.g. 321) is then deposited. A channel area can be masked and defined. After the photoresist is stripped, a first metal can be deposit-filled and planarized using CMP.

Note that the substrate 301 herein can correspond to the substrate 101 in FIGS. 1A-1F. The dielectric material 303 can correspond to the dielectric material 103. The first metal layer 321 can correspond to the first metal layer 121. The channel structure 331 can correspond to the channel structure 131. The source region 336 can correspond to the source region 136. The drain region 335 can correspond to the drain region 135.

Figures 4A, 4B, 4C, 4D:
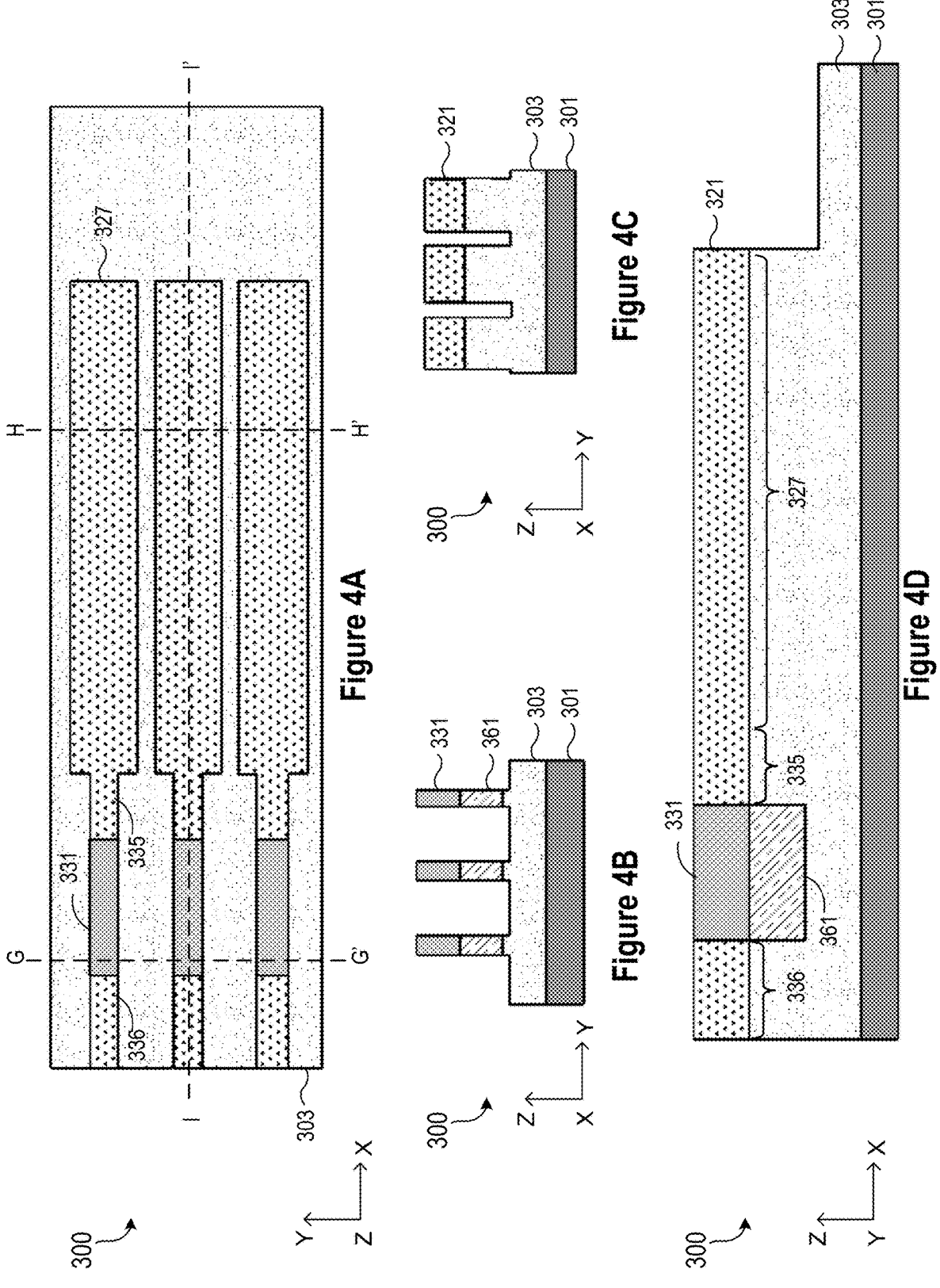
FIGS. 4B, 4C and 4D show vertical cross-sectional views taken along line cuts GG', HH' and II' in FIG. 4A respectively in accordance with some embodiments of the present disclosure.

FIGS. 4B, 4C and 4D can respectively show vertical cross-sectional views taken along line cuts GG', HH' and II' in FIG. 4A. In FIGS. 4A-4D, the first metal layer 321 and the channel structure 331 are divided into separate or independent stacks. As a result, the first metal layer 321 can further include a capacitor metal portion 327 that is wider than the drain region 335 and the source region 336 in the Y direction, which can provide a higher capacitance value. Note that the capacitor metal portion 327 can correspond to the capacitor metal portion 127.

In one embodiment, lithography is performed with an early slicing DRAM mask (not shown) to etch the metal (e.g. 321) and semiconductive oxide (e.g. 331). An etch mask (not shown) is formed that defines individual capacitor structures to be formed from the metal layer. The first metal layer 321, the dielectric material 303, the sacrificial material 361 and the channel structure 331 are then directionally etched. Finally, photoresist is stripped off. This defines the nanosheet width. Note that metal width in the area of capacitor can be kept wider to get higher capacitance value. Additionally, an edge (e.g. the right side) of the first metal layer 321 can be etched, and a recess can be formed in the dielectric material 303.

Figures 5A, 5B, 5C, 5D:
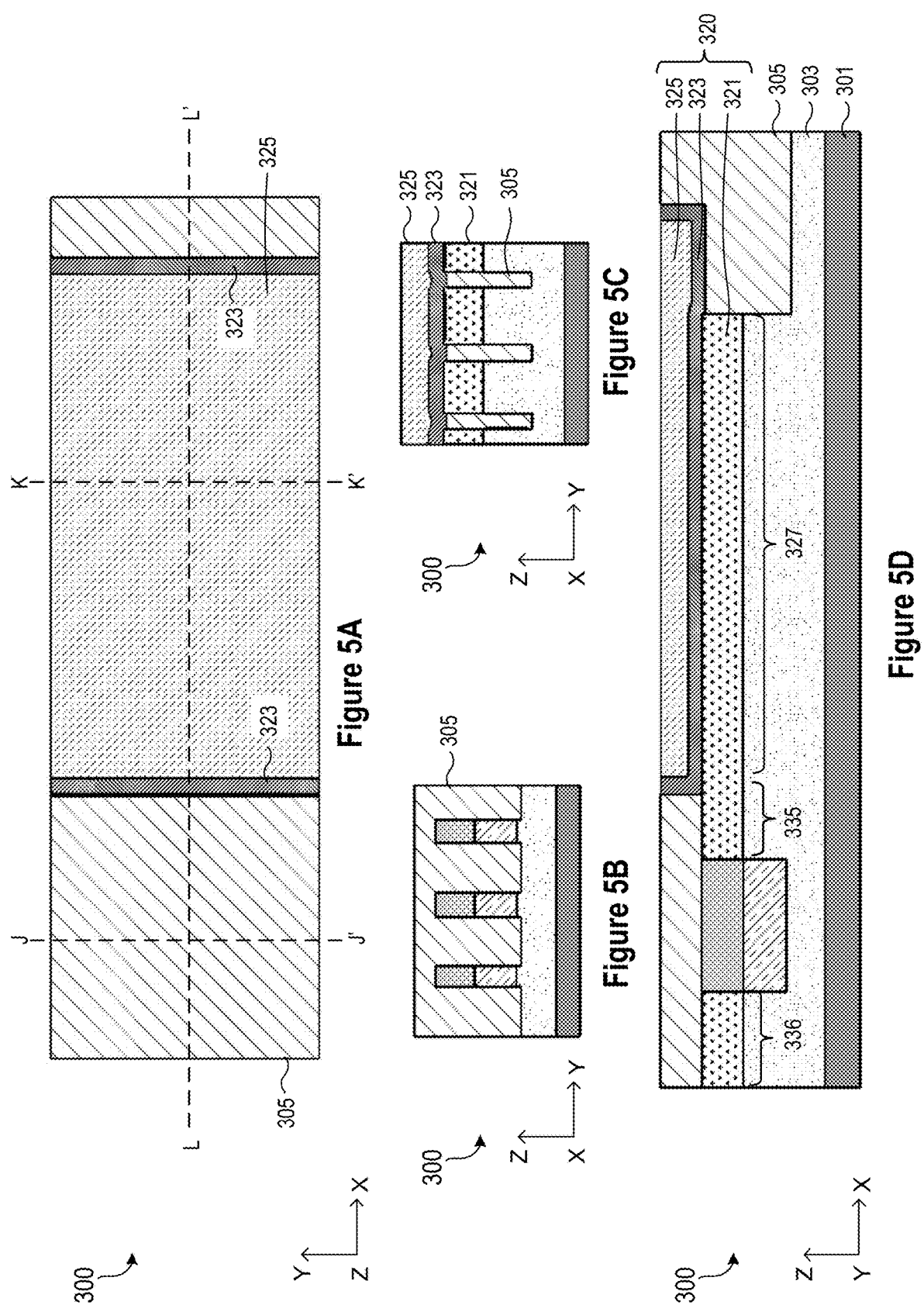
FIGS. 5B, 5C and 5D show vertical cross-sectional views taken along line cuts Jr, KK' and LL' in FIG. 5A respectively in accordance with some embodiments of the present disclosure.

FIGS. 5B, 5C and 5D can respectively show vertical cross-sectional views taken along line cuts Jr, KK' and LL' in FIG. 5A. In FIGS. 5A-5D, a dielectric material 305 is deposited and planarized. An opening (not shown) is formed in the dielectric material 305 before a capacitor dielectric layer 323 is grown along the opening and a second metal layer 325 (or a second conductive layer structure) is formed to fill the opening. Consequently, a capacitor 320 is formed, which includes the capacitor metal portion 327 of the first metal layer 321, the capacitor dielectric layer 323 and the second metal layer 325.

In one embodiment, a hard mask layer of a third dielectric (e.g. 305) is deposit-filled. Then lithography is performed with a DRAM capacitor mask (not shown), and the third dielectric is directionally etched with etch stop on the first metal layer 321. After stripping photoresist, high-k1 layer (e.g. 323) and a second metal (e.g. 325) can be formed, for example by conformal deposition such as atomic layer deposition (ALD). Then CMP is executed to planarize the surface. Note that the DRAM capacitor mask can be designed in such a way that the second metal layer 325 has a higher extension in the right side. Later for stacking, the second metal layer 325 would be then easy to short and connected to ground, without etching the second metal layer 325.

Note that the dielectric material 305 can correspond to the dielectric material 105. The capacitor dielectric layer 323 can correspond to the capacitor dielectric layer 123. The second metal layer 325 can correspond to the second metal layer 125. The capacitor 320 can correspond to the capacitor 120.

Figures 6A, 6B:
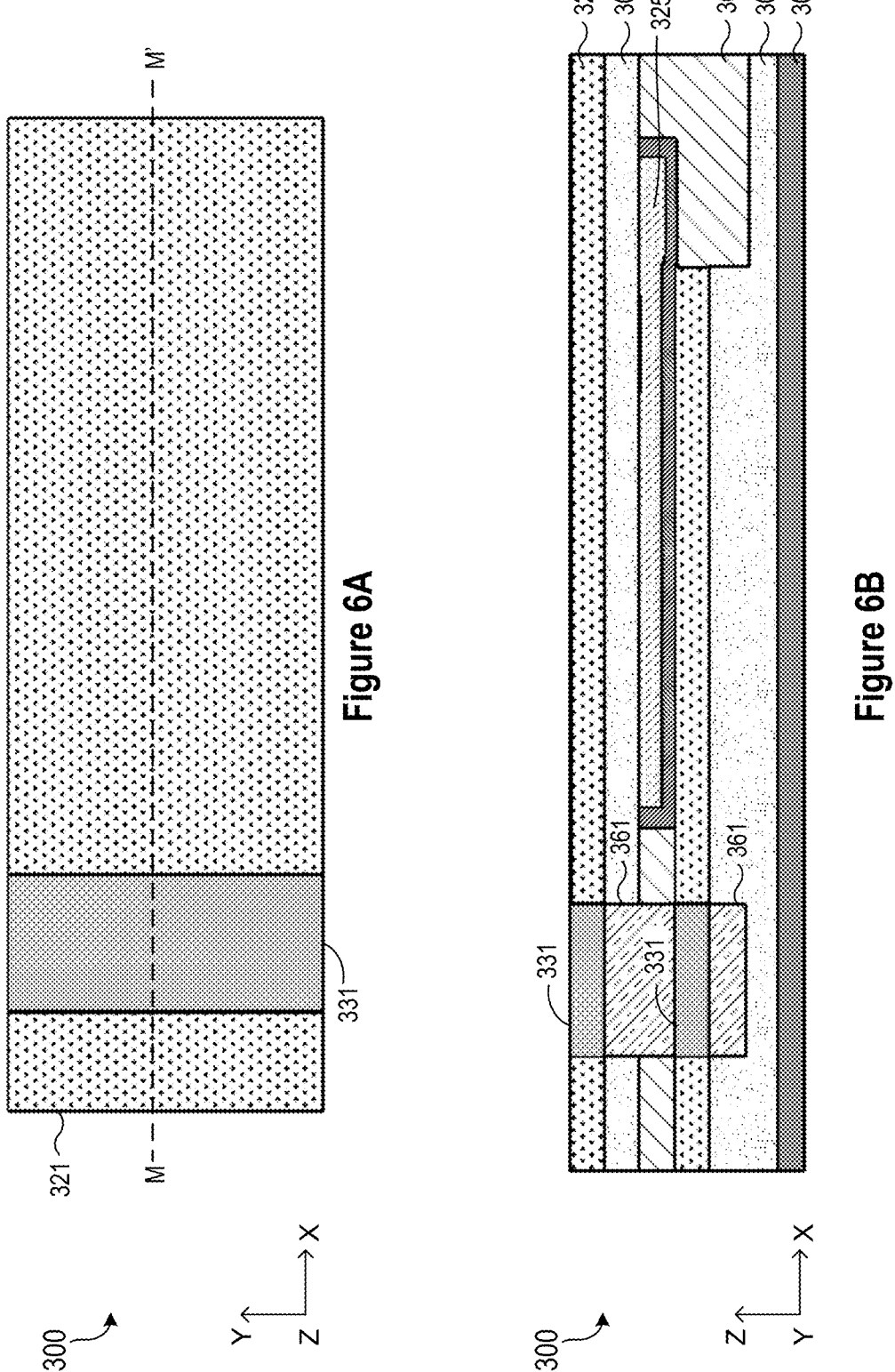
FIG. 6B show a vertical cross-sectional view taken along the line cut MM' in FIG. 6A in accordance with some embodiments of the present disclosure.

FIG. 6B can show a vertical cross-sectional view taken along the line cut MM' in FIG. 6A. In FIGS. 6A-6B, an insulation layer such as the dielectric material 303 is formed. The sacrificial material 361 is formed on the channel structure 331. Another metal layer such as the first metal layer 321 is formed before the channel structure 331 is formed in the first metal layer 321.

In one embodiment, the first dielectric (e.g. 303) is deposited for insulation between future capacitors in hierarchy stack. Then the (same) bottom DRAM gate access mask (as explained in FIGS. 3A-3B) is used to directionally etch the first and third dielectrics (e.g. 303 and 305) with etch stop on semiconductive oxide (e.g. 331), similar to what has been described in FIGS. 3A-3B. The second dielectric (e.g. 361) is then deposited and planarized. Then, the first metal (e.g. 321) is deposited and p-type conductive oxide (e.g. 331) is formed in the first metal. Therefore, a metal-p-type conductive oxide-metal structure (e.g. source region-channel structure-drain region) can be formed.

Figures 7A, 7B, 7C:
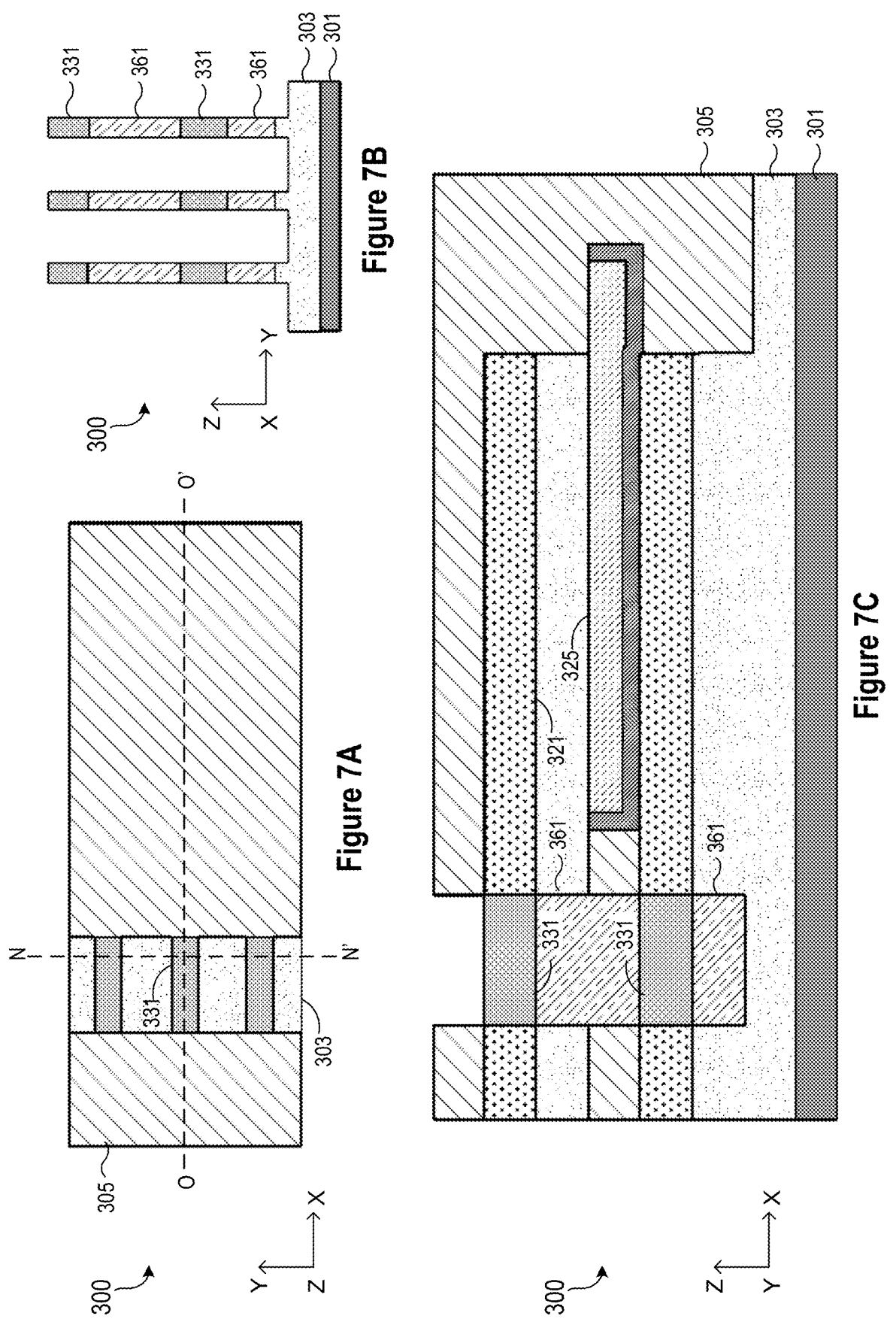
FIGS. 7B and 7C show vertical cross-sectional views taken along line cuts NN' and 00' in FIG. 7A respectively in accordance with some embodiments of the present disclosure.

FIGS. 7B and 7C can respectively show vertical cross-sectional views taken along line cuts NN' and 00' in FIG. 7A. In FIGS. 7A-7C, the first metal layer 321 and the channel structure 331 are divided into separate or independent stacks, similar to FIGS. 4A-4D. The dielectric material 305 is then deposited and planarized. Subsequently, a directional etching process is executed to uncover the aforementioned independent stacks, or more specifically, to uncover the channel structure 331 from two opposing sides in the Y direction.

In one embodiment, the first metal (e.g. 321), semiconductive oxide (e.g. 331) and the second dielectric (e.g. 361) are sliced for example using the same slicing DRAM mask as explained in FIGS. 4A-4D. The third dielectric (e.g. 305) is then deposit-filled and planarized by CMP. Then, the same bottom gate access mask or bottom DRAM access mask as explained in FIGS. 3A-3B can be used to directionally etch the third dielectric (e.g. 305) all the way to bottom with etch stop on the first dielectric (e.g. 303).

Figures 8A, 8B, 8C:
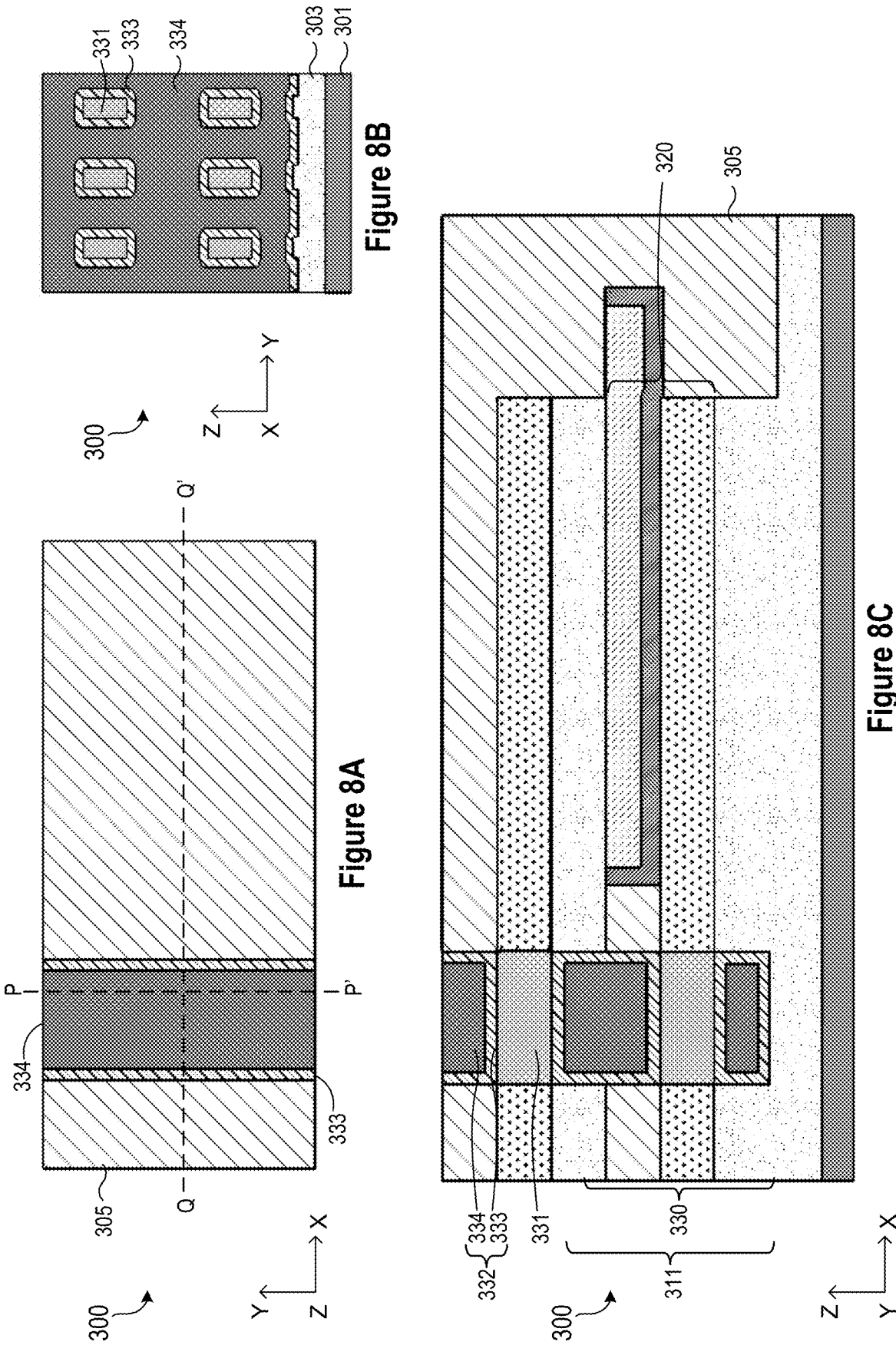
FIGS. 8B and 8C show vertical cross-sectional views taken along line cuts PP' and QQ' in FIG. 8A respectively in accordance with some embodiments of the present disclosure.

FIGS. 8B and 8C can respectively show vertical cross-sectional views taken along line cuts PP' and QQ' in FIG. 8A. In FIGS. 8A-8C, the sacrificial material 361 is removed, and a gate structure 332 is formed. The gate structure 332 includes at least one gate dielectric 333 and at least one gate metal 334. As a result, a transistor 330 is formed. Furthermore, a DRAM cell unit 311 is formed. The DRAM cell unit 311 includes the capacitor 320 that is configured to be electrically coupled to the transistor 330.

In one embodiment, the third dielectric (e.g. 361) is etch-removed. A thin layer of high-k2 (e.g. 333) is formed for example by ALD, and then a third metal (e.g. 334) is deposit-filled and planarized by CMP.

Note that the gate structure 332 can correspond to the gate structure 132. The at least one gate dielectric 333 can correspond to the at least one gate dielectric 133. The at least one gate metal 334 can correspond to the at least one gate metal 134. The transistor 330 can correspond to the transistor 130. The DRAM cell unit 311 can correspond to the DRAM cell unit 111.

Figures 9A, 9B, 9C:
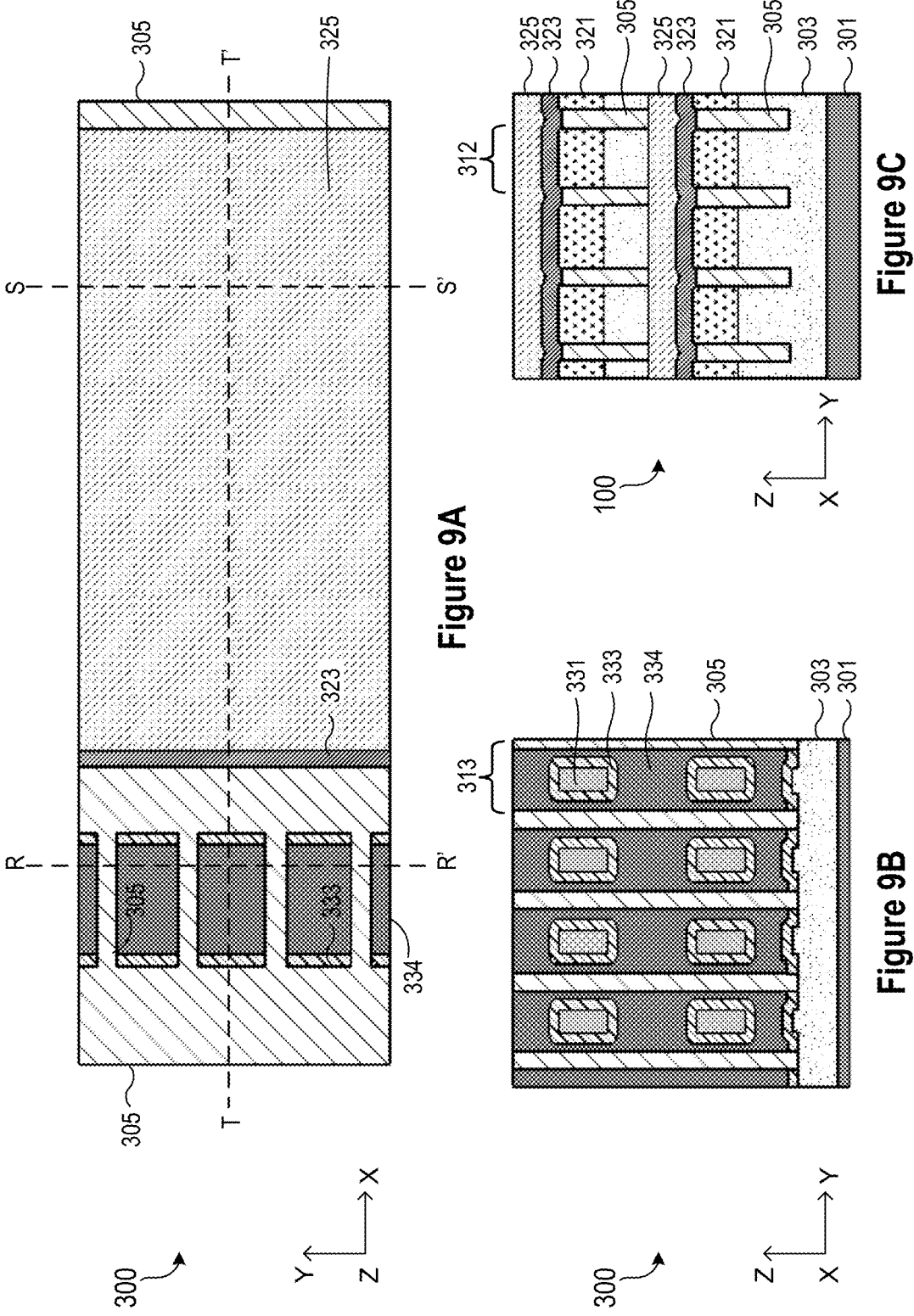
FIGS. 9B, 9C and 9D show vertical cross-sectional views taken along line cuts RR', SS' and TT' in FIG. 9A respectively in accordance with some embodiments of the present disclosure.
Figure 9D:
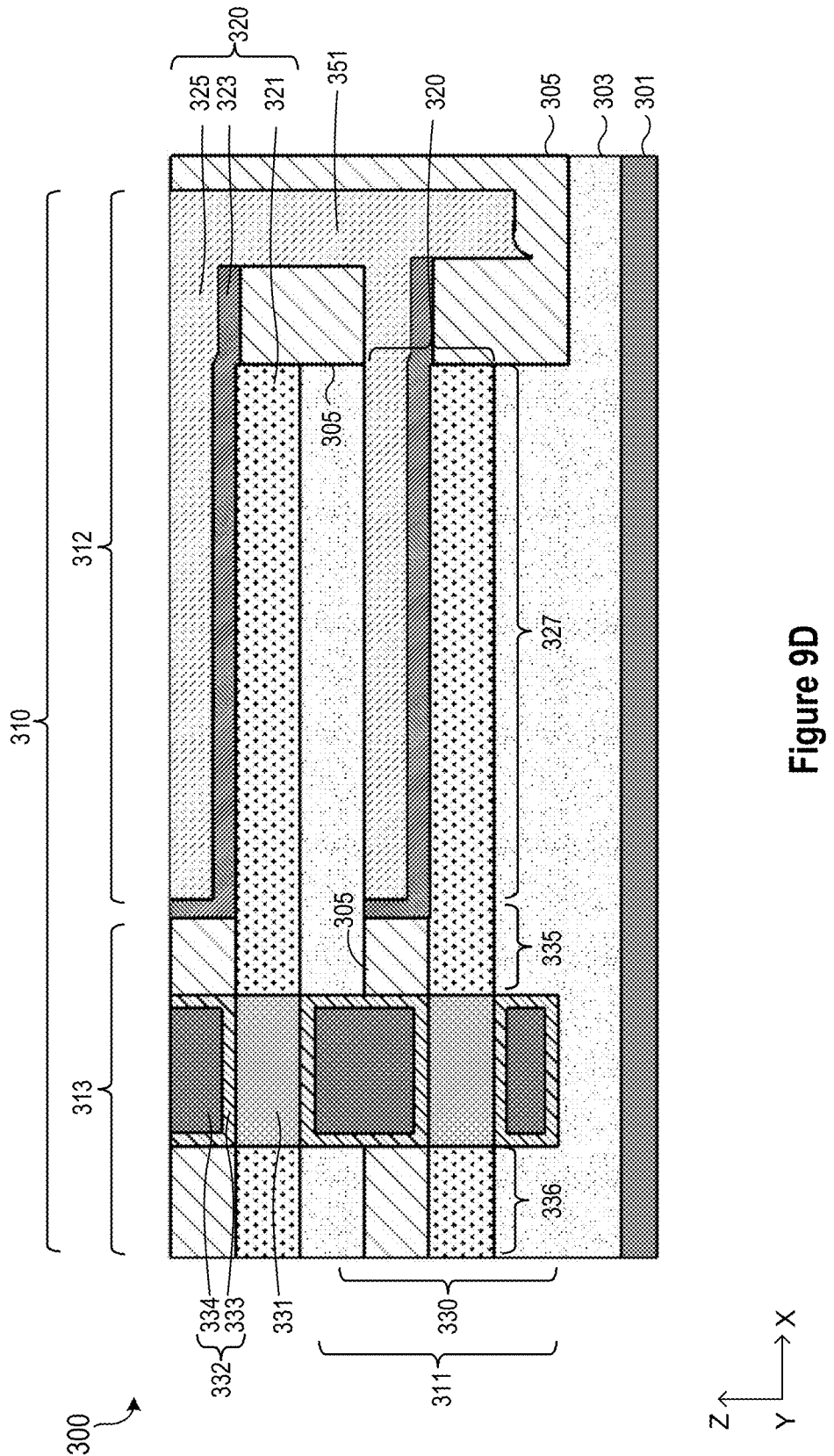

FIGS. 9B, 9C and 9D can respectively show vertical cross-sectional views taken along line cuts RR', SS' and TT' in FIG. 9A. In FIGS. 9A-9D, isolation such as the dielectric material 305 is formed between adjacent channel structures 331 and between adjacent first metal layers 321 in the XY plane. The capacitor dielectric layer 323 and the second metal layer 325 are formed in the dielectric material 305, similar to FIGS. 5A-5D. A common ground structure 351 that is configured to electrically connect to a plurality of second metal layers (e.g. 325) is formed.

In one embodiment, lithography is executed with a DRAM nanosheet slicing mask (not shown) to directionally etch the third metal (e.g. 334) and high-k2 (e.g. 333) (optional) all the way to bottom with etch stop on the first dielectric (e.g. 303) or Si (e.g. 301). The third dielectric (e.g. 305) is deposit-filled to form isolation. Then, lithography is executed with a capacitor mask (not shown), similar to FIGS. 5A-5D. Then the third dielectric (e.g. 305) is directionally etched with etch stop on the first metal (e.g. 321). After stripping off the photoresist, atomic layer deposition with high-k1 (e.g. 323) is executed. Then again, lithography is executed with a capacitor ground mask (not shown) to directionally etch the third dielectric (e.g. 305) and high-k1 (e.g. 323) only. Note that there is no need to etch any metal. After stripping off the photoresist, the second metal (e.g. 325) is deposit-filled and then planarized by CMP to form the second metal layer 325 and the common ground structure 351.

As a result, a stack of dynamic random access memory (DRAM) cell units (hereinafter referred to as a memory stack 310) is formed. The memory stack 310 includes a stack of capacitors (hereinafter referred to as a capacitor stack 312) and a stack of transistors (hereinafter referred to as a transistor stack 313) adjacent to each other. The memory stack 310 includes a plurality of DRAM cell units 311 stacked in the Z direction. The semiconductor device 300 can include a plurality of memory stacks 310 arranged in the XY plane.

Note that the common ground structure 351 can correspond to the common ground structure 151. The memory stack 310 can correspond to the memory stack 110. The capacitor stack 312 can correspond to the capacitor stack 112. The transistor stack 313 can correspond to the transistor stack 113. Therefore, the semiconductor device 300 can correspond to the semiconductor device 100 in FIGS. 1A-1D.

Figures 10A, 10B:
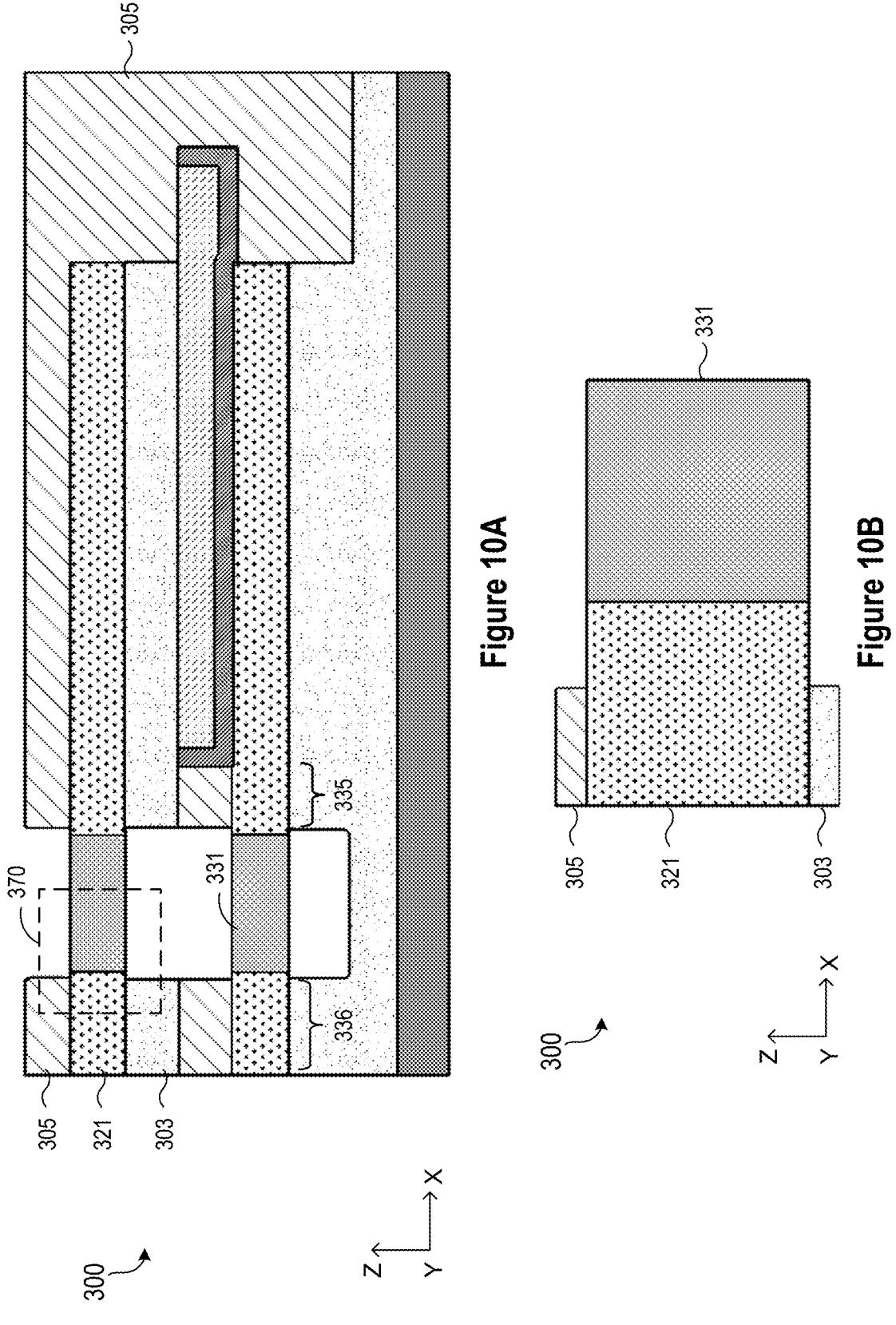
FIG. 10A show a vertical cross-sectional view of a semiconductor device at an intermediate step of manufacturing, in accordance with one embodiment of the present disclosure.
FIG. 10B shows an expanded view of the rectangle 370 in FIG. 10A in accordance with one embodiment of the present disclosure.

FIG. 10A shows a vertical cross-sectional view of the semiconductor device 300, in accordance with an alternative embodiment. FIG. 10B can show an expanded view of the rectangle 370 in FIG. 10A. A nanosheet transistor and a wrapped-around capacitor with doped 2D Material can be formed, though 2D semiconductor material can be grown selectively in this option. Instead of semiconductive oxide, the layer can be any other existing oxide on which 2D material can grow selectively.

In FIGS. 8A-8C, the sacrificial material 361 is removed, and then the gate structure 332 is formed. However in FIGS. 10A-10B, dielectric materials 303 and 305 can be laterally etched, for example slightly in the X direction, so that a two-dimensional (2D) semiconductor material has enough contact area to the first metal layer 321. In some embodiments, the channel structure 331 includes a semiconducting oxide. While not shown, a 2D semiconductor material, which corresponds to the 2D semiconductor material 138, can be disposed all around the semiconducting oxide (e.g. 331), the drain region 335 and the source region 336. Then, the gate structure 332 can be formed. Therefore, the semiconductor device 300 can eventually become the semiconductor device 100 in FIGS. 1E-1F.

Note that in FIGS. 7A-7C, the sacrificial material 361 and the channel structure 331 can be aligned and have an equal width in the X direction. However, in alternative embodiments of FIGS. 10A-10B, the sacrificial material 361 (not shown) can be wider than the channel structure 331 in the X direction. More specifically, the sacrificial material 361 can extend beyond the channel structure 331 in the X direction and thus be in direct contact with the drain region 335 and the source region 336. As a result, after the sacrificial material 361 is removed, the drain region 335 and the source region 336 can be uncovered as shown. Then, the aforementioned 2D semiconductor material can be formed all around the semiconducting oxide (e.g. 331), the drain region 335 and the source region 336.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a stack of dynamic random access memory (DRAM) cell units over a substrate in a vertical direction perpendicular to a working surface of the substrate, wherein at least one DRAM cell unit comprises a transistor and a capacitor,
wherein the capacitor comprises:
a first metal layer,
a capacitor dielectric layer positioned on the first metal layer, and
a second metal layer positioned on the capacitor dielectric layer,
wherein the capacitor is elongated in a horizontal direction parallel to the working surface of the substrate, and the second metal layer has a first end and a second end in the horizontal direction,
wherein the transistor comprises:
a channel structure, and
a gate structure disposed all around the channel structure,
wherein the first metal layer extends in the horizontal direction beyond the first end of the second metal layer to form a drain region and a source region of the transistor,
the capacitor dielectric layer is at least partially at a higher level in the vertical direction than the channel structure,
the second metal layer is at least partially at a higher level in the vertical direction than the channel structure,
the first metal layer is coplanar with the channel structure, and
the drain region and the source region of the first metal layer are in direct contact with the channel structure.

2. The semiconductor device of claim 1, wherein:
the channel structure comprises a semiconducting oxide positioned between the drain region and the source region.

3. The semiconductor device of claim 2, wherein:
the channel structure further comprises a two-dimensional (2D) semiconductor material disposed all around the semiconducting oxide.

4. The semiconductor device of claim 3, wherein:
the 2D semiconductor material extends beyond the semiconducting oxide in the horizontal direction and is disposed all around the drain region and the source region.

5. The semiconductor device of claim 1, further comprising:
a common ground structure configured to electrically connect to a plurality of second metal layers of a plurality of DRAM cell units of the stack of DRAM cell units on respective second ends.

6. A semiconductor device, comprising:
a stack of dynamic random access memory (DRAM) cell units over a substrate in a vertical direction perpendicular to a working surface of the substrate, wherein at least one DRAM cell unit comprises a transistor and a capacitor,
wherein the capacitor comprises:
a first metal layer,
a capacitor dielectric layer positioned on the first metal layer, and
a second metal layer positioned on the capacitor dielectric layer,
wherein the capacitor is elongated in a horizontal direction parallel to the working surface of the substrate, and the second metal layer has a first end and a second end in the horizontal direction,
wherein the transistor comprises:
a channel structure, and
a gate structure disposed all around the channel structure,
wherein the first metal layer extends in the horizontal direction beyond the first end of the second metal layer to form a drain region and a source region of the transistor,
the capacitor dielectric layer is at least partially at a higher level in the vertical direction than the channel structure,
the second metal layer is at least partially at a higher level in the vertical direction than the channel structure, and
a capacitor metal portion of the first metal layer, which is in direct contact with the capacitor dielectric layer, is wider than the drain region and the source region in another horizontal direction.

7. The semiconductor device of claim 1, wherein:
the channel structure is configured to have a current flow path in the horizontal direction.

8. The semiconductor device of claim 1, further comprising:
a dielectric material positioned between the gate structure and the capacitor dielectric layer.

9. The semiconductor device of claim 8, wherein the capacitor dielectric layer comprises:
a horizontal portion positioned between the second metal layer and the first metal layer; and
a vertical portion positioned between the second metal layer and the dielectric material.

10. A method of manufacturing a semiconductor device, the method comprising:
forming a stack of dynamic random access memory (DRAM) cell units over a substrate in a vertical direction perpendicular to a working surface of the substrate, wherein at least one DRAM cell unit comprises a transistor and a capacitor, and the forming the stack of DRAM cell units comprises forming the transistor and forming the capacitor,
wherein the forming the capacitor comprises:
forming a first metal layer,
forming a capacitor dielectric layer positioned on the first metal layer, and
forming a second metal layer positioned on the capacitor dielectric layer,
wherein the capacitor is elongated in a horizontal direction parallel to the working surface of the substrate, and the second metal layer has a first end and a second end in the horizontal direction,
wherein the forming the transistor comprises:
forming a channel structure, and
forming a gate structure disposed all around the channel structure, wherein the first metal layer extends in the horizontal direction beyond the first end of the second metal layer to form a drain region and a source region of the transistor, the capacitor dielectric layer is at least partially at a higher level in the vertical direction than the channel structure, the second metal layer is at least partially at a higher level in the vertical direction than the channel structure, the first metal layer is coplanar with the channel structure, and the drain region and the source region of the first metal layer are in direct contact with the channel structure.

11. The method of claim 10, wherein the forming the channel structure comprises:

forming a semiconducting oxide between the drain region and the source region.

12. The method of claim 11, further comprising:

forming a two-dimensional (2D) semiconductor material all around the semiconducting oxide.

13. The method of claim 12, wherein:

the 2D semiconductor material extends beyond the semiconducting oxide in the horizontal direction and is disposed all around the drain region and the source region.

14. The method of claim 10, further comprising:

forming a common ground structure configured to electrically connect to a plurality of second metal layers of a plurality of DRAM cell units of the stack of DRAM cell units on respective second ends.

15. The method of claim 10, further comprising:

forming the channel structure in the first metal layer; and forming a sacrificial material over and below the channel structure.

16. The method of claim 15, further comprising:

uncovering the transistor from two opposing sides;

removing the sacrificial material; and forming the gate structure all around the channel structure.

17. The method of claim 16, wherein:

the drain region and the source region are uncovered as a result of the removing the sacrificial material.

18. The method of claim 10, wherein:

a capacitor metal portion of the first metal layer, which is in direct contact with the capacitor dielectric layer, is wider than the drain region and the source region in another horizontal direction.

19. The method of claim 18, wherein:

the another horizontal direction is perpendicular to the horizontal direction.

20. The method of claim 6, wherein:

the another horizontal direction is perpendicular to the horizontal direction.

* * * * *